(12) United States Patent
Jouvray et al.

(10) Patent No.: US 12,012,654 B2
(45) Date of Patent: Jun. 18, 2024

(54) DEVICE FOR COATING A SUBSTRATE WITH A CARBON-CONTAINING COATING

(71) Applicant: AIXTRON SE, Herzogenrath (DE)

(72) Inventors: Alexandre Jouvray, Huntingdon (GB); Matthew Perry, Market Harborough (GB)

(73) Assignee: AIXTRON SE, Herzogenrath (DE)

( * ) Notice: Subject to any disclaimer, the term of this patent is extended or adjusted under 35 U.S.C. 154(b) by 129 days.

(21) Appl. No.: 17/051,871

(22) PCT Filed: Apr. 30, 2019

(86) PCT No.: PCT/EP2019/061065
§ 371 (c)(1),
(2) Date: Oct. 30, 2020

(87) PCT Pub. No.: WO2019/211280
PCT Pub. Date: Nov. 7, 2019

(65) Prior Publication Data
US 2021/0189565 A1    Jun. 24, 2021

(30) Foreign Application Priority Data

Apr. 30, 2018 (DE) .................... 10 2018 110 348.4
Apr. 30, 2018 (DE) .................... 10 2018 110 350.6

(51) Int. Cl.
*C23C 16/26*     (2006.01)
*C23C 16/455*    (2006.01)
(Continued)

(52) U.S. Cl.
CPC ............. *C23C 16/46* (2013.01); *C23C 16/26* (2013.01); *C23C 16/45502* (2013.01); *C23C 16/52* (2013.01); *C23C 16/545* (2013.01)

(58) Field of Classification Search
None
See application file for complete search history.

(56) References Cited

U.S. PATENT DOCUMENTS 3,032,890 A * 5/1962 Brick .................... C23C 14/562
                                                        34/92
5,266,116 A * 11/1993 Fujioka ................ C23C 16/507
                                                        136/258
(Continued)

FOREIGN PATENT DOCUMENTS

DE          610 964 C        3/1935
DE       103 22 935 A1      12/2004
(Continued)

OTHER PUBLICATIONS

International Search Report dated Oct. 18, 2019, from the ISA/European Patent Office, for International Patent Application No. PCT/EP2019/061065 (filed Apr. 30, 2019), 10 pgs.
(Continued)

*Primary Examiner* — Karla A Moore
(74) *Attorney, Agent, or Firm* — Ascenda Law Group, PC

(57) ABSTRACT

In a device for depositing graphene, carbon nano-tubes or other, in particular carbon-contained coatings on a strip-shaped substrate, the substrate enters a reactor housing through an inlet opening and is transported in a transport direction through a process area that is tempered by a tempering device, before being exiting the reactor housing through an outlet opening. Heat-transport-inhibiting means are arranged between the process area and the inlet opening and/or the outlet opening by means of which a heat transport from the process area to the inlet opening or the outlet opening is reduced. Guide elements are also provided in order to guide the substrate into and out of regions directly adjacent to the inlet and outlet openings.

7 Claims, 16 Drawing Sheets

(51) Int. Cl.
*C23C 16/46* (2006.01)
*C23C 16/52* (2006.01)
*C23C 16/54* (2006.01)

(56) References Cited

U.S. PATENT DOCUMENTS

| | | | |
|---|---|---|---|
| 5,571,749 A | 11/1996 | Matsuda et al. | |
| 5,772,715 A * | 6/1998 | McMaster | C03B 18/16 65/157 |
| 6,716,288 B2 * | 4/2004 | Tognetti | C30B 25/08 118/733 |
| 7,896,968 B2 | 3/2011 | Hirono et al. | |
| 9,227,171 B2 | 1/2016 | Shibuya et al. | |
| 2002/0170496 A1 | 11/2002 | Ha et al. | |
| 2003/0010291 A1 * | 1/2003 | Song | C23C 16/4409 118/724 |
| 2004/0045504 A1 | 3/2004 | Yajima et al. | |
| 2009/0084316 A1 * | 4/2009 | Lee | H01L 21/6719 118/719 |
| 2011/0039017 A1 | 2/2011 | Okazaki et al. | |
| 2012/0031565 A1 * | 2/2012 | Yokoyama | H01L 21/6776 226/176 |
| 2015/0140211 A1 * | 5/2015 | Strobl | C23C 16/4404 118/725 |
| 2016/0031712 A1 | 2/2016 | Moon et al. | |
| 2016/0340776 A1 | 11/2016 | Sauer et al. | |
| 2017/0314134 A1 | 11/2017 | Franken et al. | |
| 2018/0209044 A1 | 7/2018 | Hong et al. | |

FOREIGN PATENT DOCUMENTS

| | | |
|---|---|---|
| DE | 10 2014 106 451 A1 | 11/2015 |
| DE | 10 2015 013 799 A1 | 4/2017 |
| JP | H06 184747 A | 7/1994 |
| JP | 2012-166991 A | 9/2012 |

OTHER PUBLICATIONS

Written Opinion dated Oct. 18, 2019, from the ISA/European Patent Office, for International Patent Application No. PCT/EP2019/061065 (filed Apr. 30, 2019), 12 pgs.

International Preliminary Report on Patentability dated Nov. 3, 2020, from The International Bureau of WIPO, for International Patent Application No. PCT/EP2019/061065 (filed Apr. 30, 2019), 24 pgs.

Written Opinion dated Oct. 18, 2019, from the ISA/European Patent Office, for International Patent Application No. PCT/EP2019/061065 (filed Apr. 30, 2019), English translation, 10 pgs.

* cited by examiner

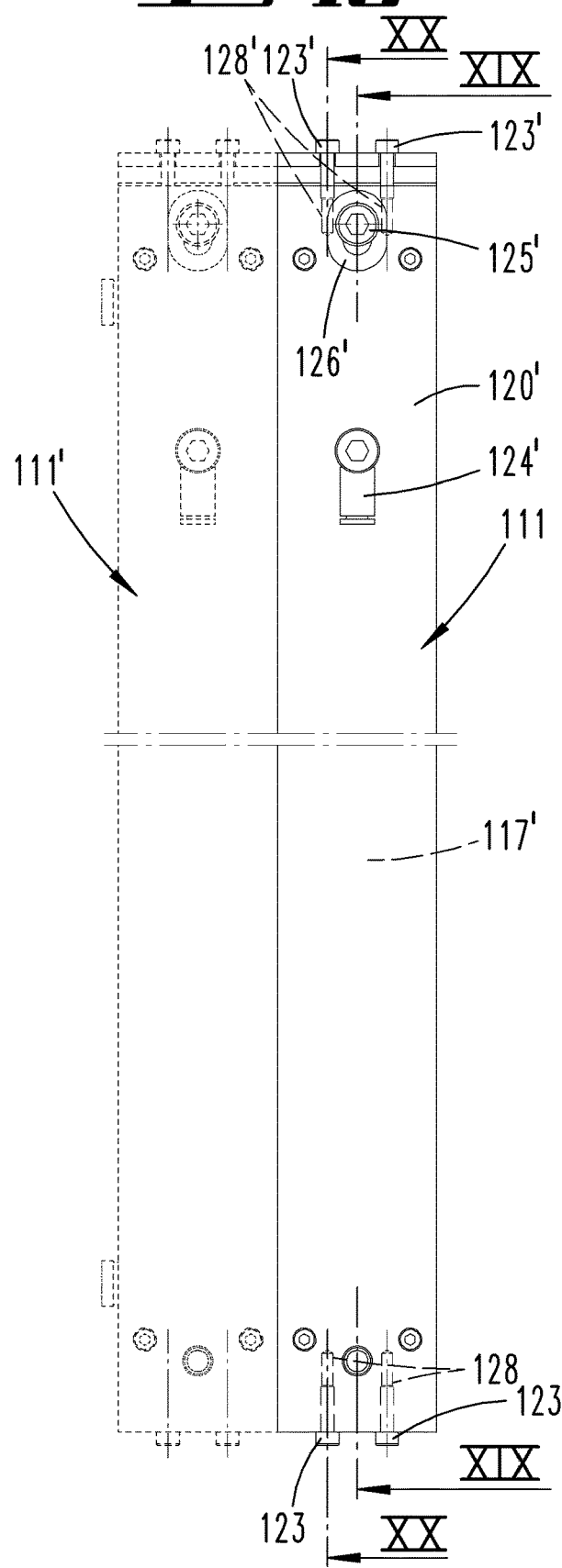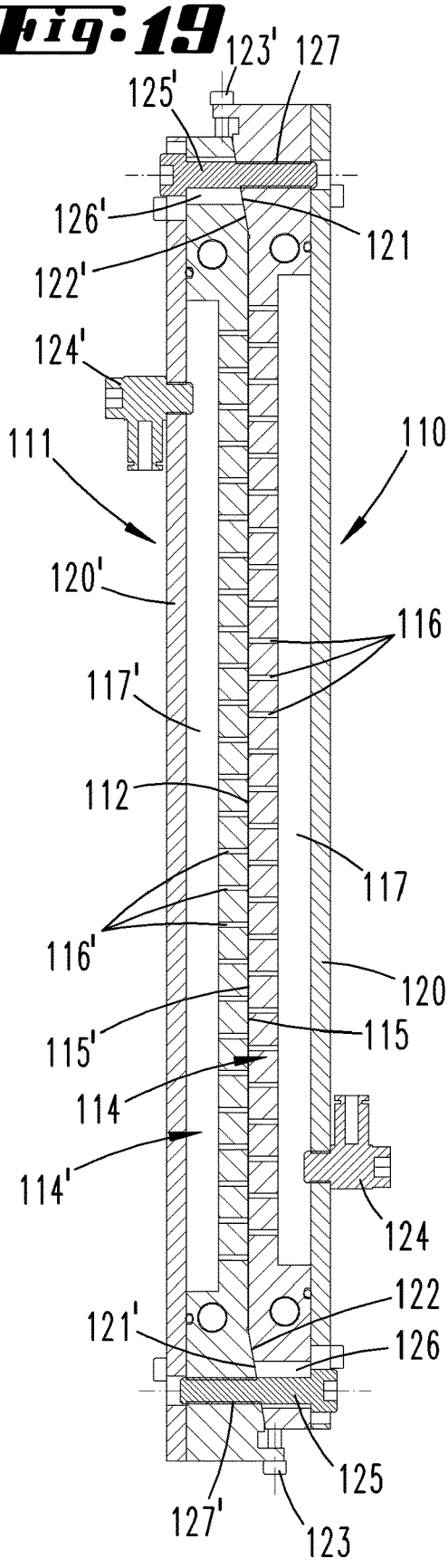

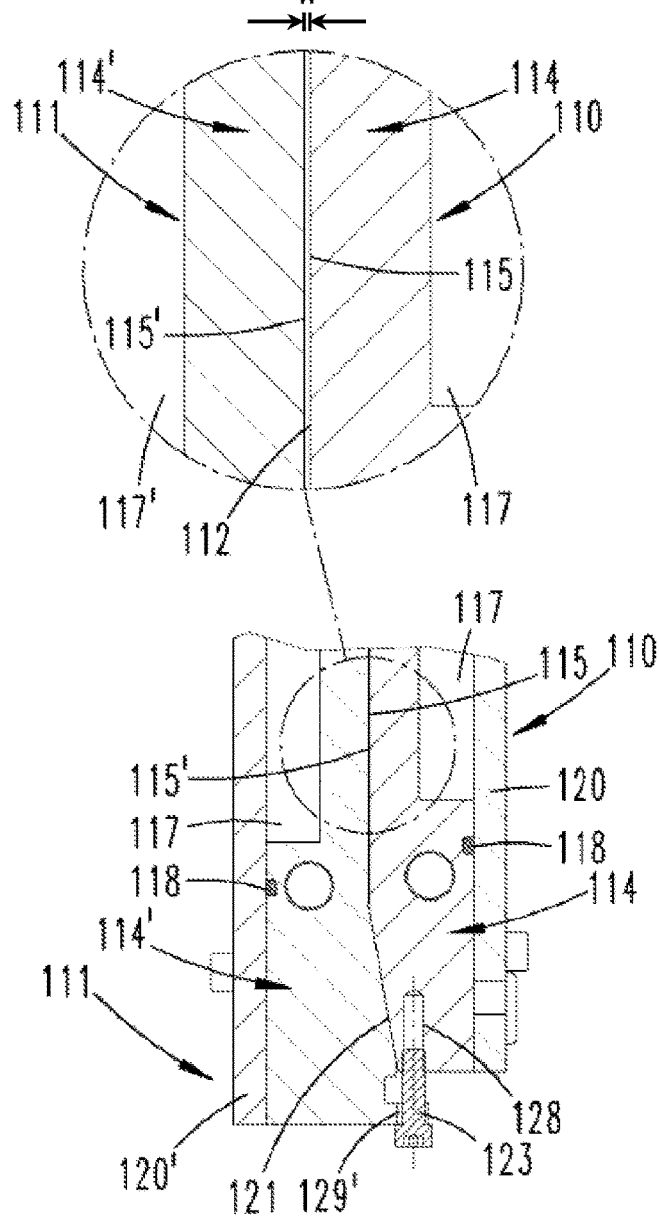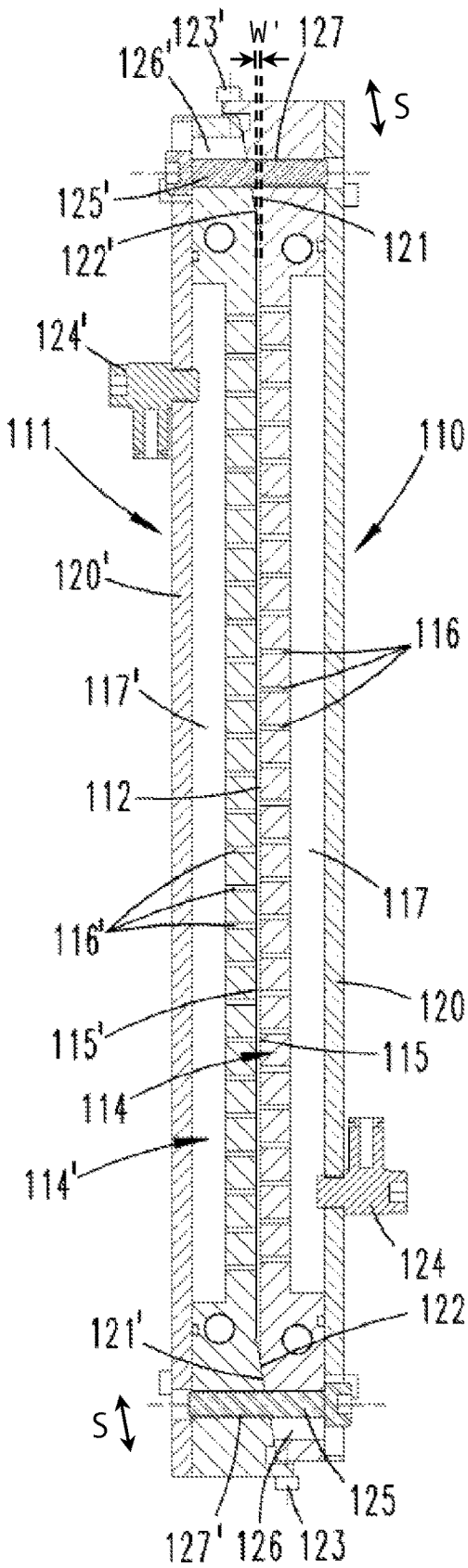

DEVICE FOR COATING A SUBSTRATE WITH A CARBON-CONTAINING COATING

RELATED APPLICATIONS

This application is a National Stage under 35 USC 371 of and claims priority to International Application No. PCT/EP2019/061065, filed 30 Apr. 2019, which claims the priority benefit of DE Application No. 10 2018 110 350.6, filed 30 Apr. 2018 and DE Application No. 10 2018 110 348.4, filed 30 Apr. 2018.

FIELD OF THE INVENTION

The invention pertains to a device for depositing graphene, carbon nanotubes or other coatings, particularly carbon-containing coatings, on a strip-shaped substrate that enters a reactor housing through an inlet opening and exits the reactor housing through an outlet opening, wherein said substrate is transported in a transport direction from the inlet opening to the outlet opening through a processing zone that is arranged in the reactor housing and tempered, in particular, by at least one heating device, and wherein a gas inlet of a gas supply conduit leads into said processing zone.

BACKGROUND

A device for depositing carbon-containing coatings such as graphene or carbon nanotubes (CNT) is described in U.S. Pat. No. 9,227,171 B2. The device described in this publication comprises a reactor that extends in a horizontal direction and has multiple zones, which lie directly adjacent to one another in the horizontal direction and through which an endless substrate is transported.

US 2016/0031712 A1 describes a device for producing graphene with multiple processing zones that are arranged behind one another in a transport direction of a substrate. Heating devices are provided in the processing zones in order to heat the substrate to a process temperature.

Devices for the treatment of substrates with heat protection shields are known from US 2017/0314134 A1.

The relevant prior art furthermore includes US 2018/0209044 A1, JP 2012-166991 A, DE 103 22 935 A1, DE 10 2014 106 451 A1 and DE 10 2015 013 799 A1.

SUMMARY OF THE INVENTION

The invention is based on the objective of advantageously enhancing a device of the initially described type, particularly in terms of its use, and of disclosing means that make it possible to improve the coating result.

An inventive device for depositing graphene or carbon nanotubes or other coatings, particularly carbon-containing coatings, comprises a reactor housing that has two opposite openings. One opening, particularly a gap-shaped opening, forms an inlet opening for a substrate. A second opening forms an outlet opening for the substrate. The substrate preferably is a strip-shaped metal sheet that is unwound from a first roll and continuously guided through a processing zone of the reactor in order to once again exit through the outlet opening. A second roll, on which the substrate is wound up, is located behind the outlet opening. A gas inlet, which may form the end of the tubular gas conduit, may lead into the processing zone in order to introduce a process gas such as $CH_4$ or another carbon-containing gas into the processing zone. A gas outlet may be located on the opposite side in order to pump the gaseous components out of the processing zone. The introduction of the process gas preferably takes place with a carrier gas that does not react with the process gas. Measures have to be taken in order to prevent an admission of oxygen into the reactor from outside the reactor. To this end, the inlet opening and/or the outlet opening can be flushed with an inert gas such that a diffusion barrier is formed. It is proposed that the gap width of an inlet gap or an outlet gap in the region of the reactor wall is adjustable. A tempering device is located within the reactor and makes it possible to temper the substrate or an atmosphere surrounding the substrate. The tempering device particularly is a heating device that makes it possible to heat the process gas in order to form carbon, particularly due to pyrolytic decomposition, wherein the thusly formed carbon is deposited on the substrate in the form of graphene or carbon nanotubes. The regions of the reactor wall surrounding the inlet opening and the outlet opening can be cooled with suitable means. The invention proposes means for inhibiting the heat transfer from the heated processing zone toward the inlet opening or toward the outlet opening.

The means proposed by the invention particularly are provided in an inlet region or an outlet region of the reactor cavity, wherein the inlet region is arranged between the processing zone and the inlet opening and the outlet region is arranged between the processing zone and the outlet opening. The heat transfer-inhibiting means particularly are arranged directly adjacent to a closing plate that respectively contains the inlet opening or the outlet opening and closes the preferably cylindrical reactor on its end faces. In one variation, it is proposed that the heat transfer-inhibiting means form one or more thermal radiation shields. It is furthermore proposed that the heat transfer-inhibiting means are formed by flat bodies. The flat bodies may be sheet metal parts. They may extend transversely or obliquely to the transport direction of the substrate. It is furthermore proposed that the heat transfer-inhibiting means occupy at least 75 percent, preferably at least 80 percent or 90 percent, of a cross-sectional area of the inlet region or the outlet region. The inlet region and the outlet region preferably have a clear cross-sectional area in the shape of a circular disk. The majority of this clear cross-sectional area is occupied by the heat transfer-inhibiting means, wherein it is preferred that a gap zone extending diametrically through the clear cross section and a ring zone surrounding the heat transfer-inhibiting means remain clear. In an enhancement of the invention, it is proposed that slots are arranged in the heat transfer-inhibiting means, which particularly are made of sheet metal. These slots may be narrow slots that are open toward an edge of the heat transfer-inhibiting means. The slots may have a slot width that approximately corresponds to the material thickness of the heat transfer-inhibiting means made of sheet metal. The heat transfer-inhibiting means particularly may have an outline contour that extends on a circular arc-shaped line. At least the inlet region and/or the outlet region likewise have a circular outline contour. The inlet region and the outlet region preferably are formed by an end section of an inner pipe (liner pipe), which extends through the entire reactor cavity and forms the processing zone in its central region. The latter may be surrounded by a heating device in the form of a heating coil. The means for inhibiting the heat transfer arranged in the inlet region or the outlet region may also be surrounded by a heating coil. However, these means may alternatively also be surrounded by a cooling coil. In an enhancement of the invention, it is proposed that the heat transfer-inhibiting means form through-bores for rods or pipes. They may be displaceably guided on rods or pipes. At least one of the pipes may be a pipe of a gas inlet and/or a pipe of a gas outlet. A heat transfer-inhibiting means may be composed of two parts, wherein a gap, through which the substrate is transported, remains between the two preferably semicircular parts. In an enhancement of the invention, it is proposed that multiple heat transfer-inhibiting means, namely at least two but preferably three or four heat transfer-inhibiting means, are arranged behind one another in the transport direction. Such means for inhibiting the heat transfer, which particularly are formed by sheet metal reflectors, may be held at a distance from one another with the aid of spacer means such as spacer sleeves. The spacer sleeves may be arranged on the pipes. However, the spacer sleeves may also be arranged on rods, on which the heat transfer-inhibiting means are displaceably arranged in the reactor. Furthermore, the heat transfer-inhibiting means may have surface areas that differ in size and particularly occupy correspondingly varying cross-sectional areas of the inlet region or the outlet region, wherein at least one heat transfer-inhibiting means with a smaller cross section is arranged at the location lying most remote from the inlet opening or the outlet opening. A heat transfer-inhibiting means may have a cruciform shape. The heat transfer-inhibiting element of cruciform shape preferably has four sections that protrude from a center of the heat transfer-inhibiting means in a radial direction. The center is formed by a center line extending transversely to the transport direction. Two flat bodies may protrude from this center line in a V-shaped manner on one broad side. Two flat bodies may likewise protrude from a center line in a V-shaped manner on the opposite broad side. Two flat bodies protruding obliquely in the transport direction and two flat bodies protruding opposite to the transport direction particularly are formed in this case. The means inhibiting the heat transfer may be a part consisting of two flat bodies that are connected to one another. It would be possible that two flat bodies, which are respectively bent about a ridge line, are connected to one another on the ridge lines. In this case, the ridge lines delimit a gap for the passage of the substrate. It is furthermore proposed that the two flat bodies are connected to one another by means of connecting webs, wherein the connecting webs delimit the gap for the passage of the substrate. Guide elements are provided in an enhancement of the invention that has independent significance, wherein said guide elements are located within the reactor housing and preferably arranged directly adjacent to be inlet opening or the outlet opening. They may be rods that are aligned parallel to the transport direction. A guidance gap, through which the substrate passes, may be formed between the rods. Multiple rods, preferably three rods, may be arranged on each side of the substrate. The rods may consist of a ceramic material. In a preferred embodiment of the invention, the guide elements are held by the heat transfer-inhibiting means. To this end, the heat transfer-inhibiting means may have bores or the like for holding the guide elements. It would be possible that a last means for inhibiting the heat transfer, which particularly lies remote from the inlet opening or the outlet opening, forms a stopping surface, in front of which an end face of the guide element lies. A second end face of the guide element, which points away from the aforementioned end face, may be supported on another means for inhibiting the heat transfer, preferably the first means for inhibiting the heat transfer, or on a closing plate. In an enhancement of the invention, it is proposed that the zone of the inlet region or the outlet region, which lies directly adjacent to the closing plate, is flushed with an inert gas. This measure is intended to prevent the escape of a noteworthy amount of process gas from the inlet opening or the outlet opening. In an enhancement, it is proposed that the reactor is operated in a vertical arrangement. In this variation, the inlet opening and the outlet opening are vertically spaced apart from one another such that the substrate is continuously transported through the reactor housing in the vertical direction. It preferably enters the reactor from below and exits the reactor on its upper side. This can be realized by means of deflection rollers. The gas preferably is also introduced from below such that the gas outlet is provided on the upper side of the reactor. The gas flow within the reactor therefore takes place parallel to the transport direction of the substrate, which can be coated on one or both sides.

A first aspect of the invention concerns the design of the heat transfer-inhibiting means as reflectors in the form of flat bodies. A second aspect concerns the slots and/or bores, which are arranged in the heat transfer-inhibiting means made of sheet metal and through which the rods or pipes can extend. A third aspect of the invention concerns the arrangement of multiple heat transfer-inhibiting means behind one another in the transport direction and at a distance from one another. A fourth aspect of the invention concerns the design of the heat transfer-inhibiting means in the form of a cruciform flat body. According to another aspect of the invention, it is proposed that guide elements for guiding a substrate are arranged within the reactor housing in an outlet region that lies directly adjacent to the outlet opening, and that these guide elements are formed by rods or pipes that extend in the transport direction of the substrate. These rods may be arranged directly adjacent to a gap between two parts of a heat transfer-inhibiting means.

Another aspect of the invention concerns a device for guiding a substrate into or out of a substrate treatment device through a gap extending between a first gap delimiting body and a second gap delimiting body. A device for guiding a substrate into or out of a substrate treatment device through a gap is proposed in order to additionally impede the admission of oxygen into the processing chamber. The gap width of the gap is defined by a spacing between two gap delimiting bodies. Among other things, it is essential that both gap delimiting bodies abut on one another on the oblique surfaces and can be displaced in the direction of the slope of the oblique surfaces in order to adjust the gap width, wherein the displacement takes place in the direction of the surface area of the substrate and particularly in a direction extending transversely to the transport direction of the substrate.

BRIEF DESCRIPTION OF THE DRAWINGS

Exemplary embodiments of the invention are described below with reference to the attached drawings. In these drawings:

FIG. 18 shows a top view of the paired arrangement of the gap delimiting bodies 110, 110', 111, 111' illustrated in FIG. 17, FIG. 19 shows a section along the line XIX-XIX in FIG. 18, FIG. 20 shows a section along the line XX-XX in FIG. 18 with a minimum gap width w", FIG. 21 shows the same section, however, with a maximum gap width w'.

DETAILED DESCRIPTION

Figure 1:
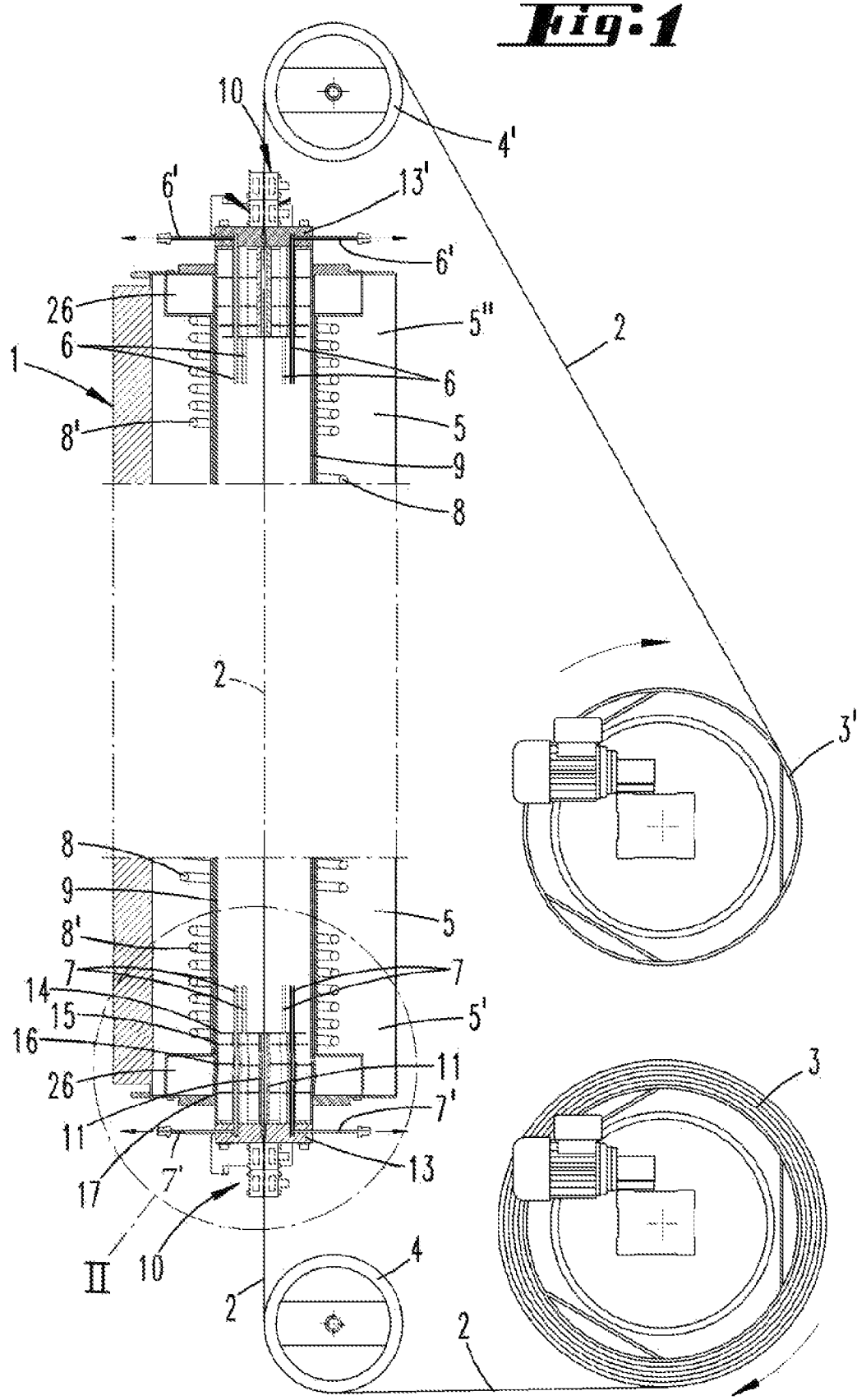
FIG. 1 shows a sectioned representation of a reactor, particularly a CVD reactor with a housing 1, which is arranged in a vertical direction, wherein a strip-shaped substrate 2 being unwound from a first roll 3 is introduced into said reactor through a bottom inlet opening 12 and withdrawn from a top opening 12' in order to be wound up on a second roll 3'.
Figure 2:
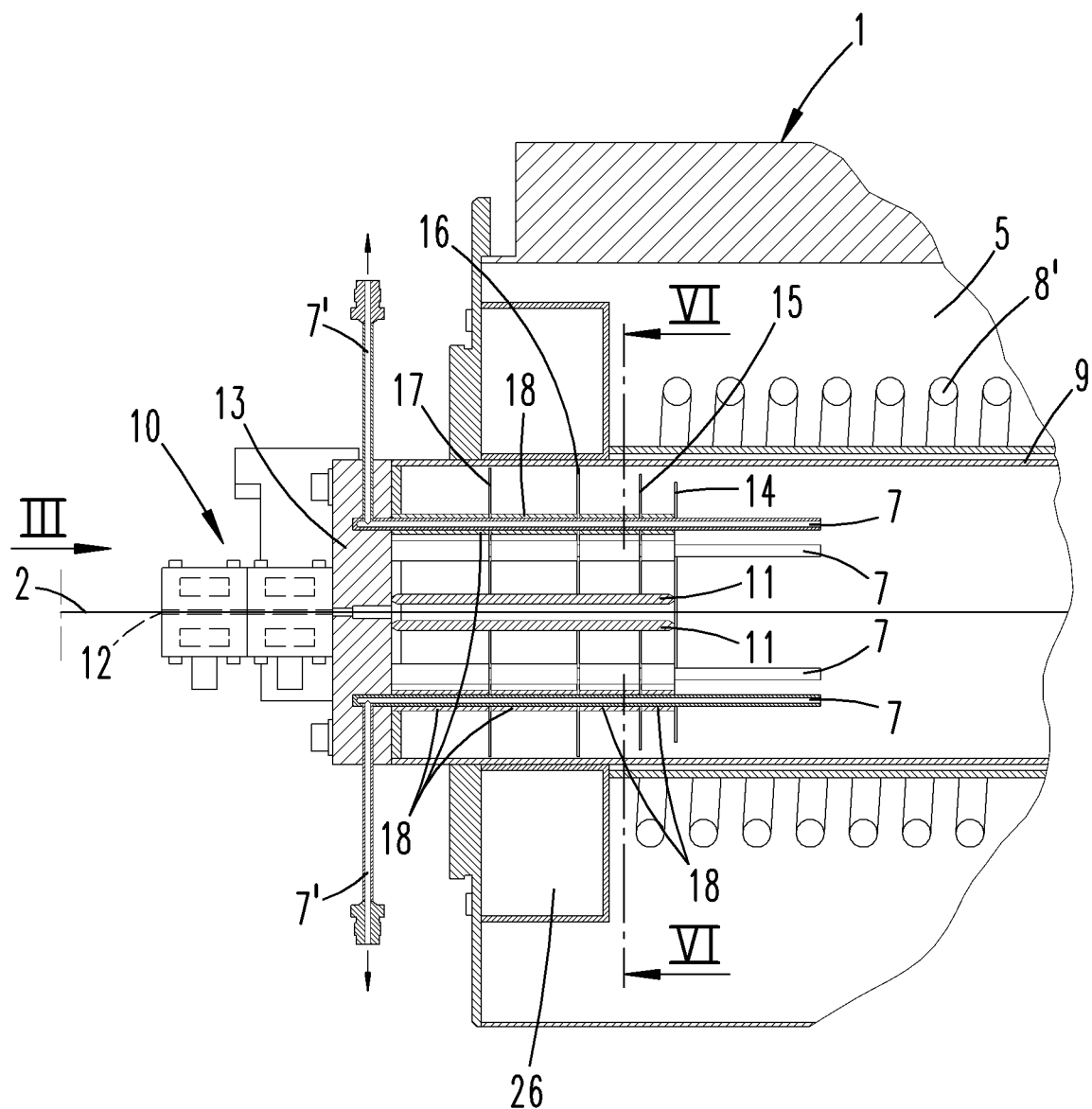
FIG. 2 shows an enlarged representation of the detail II in FIG. 1.
Figure 3:
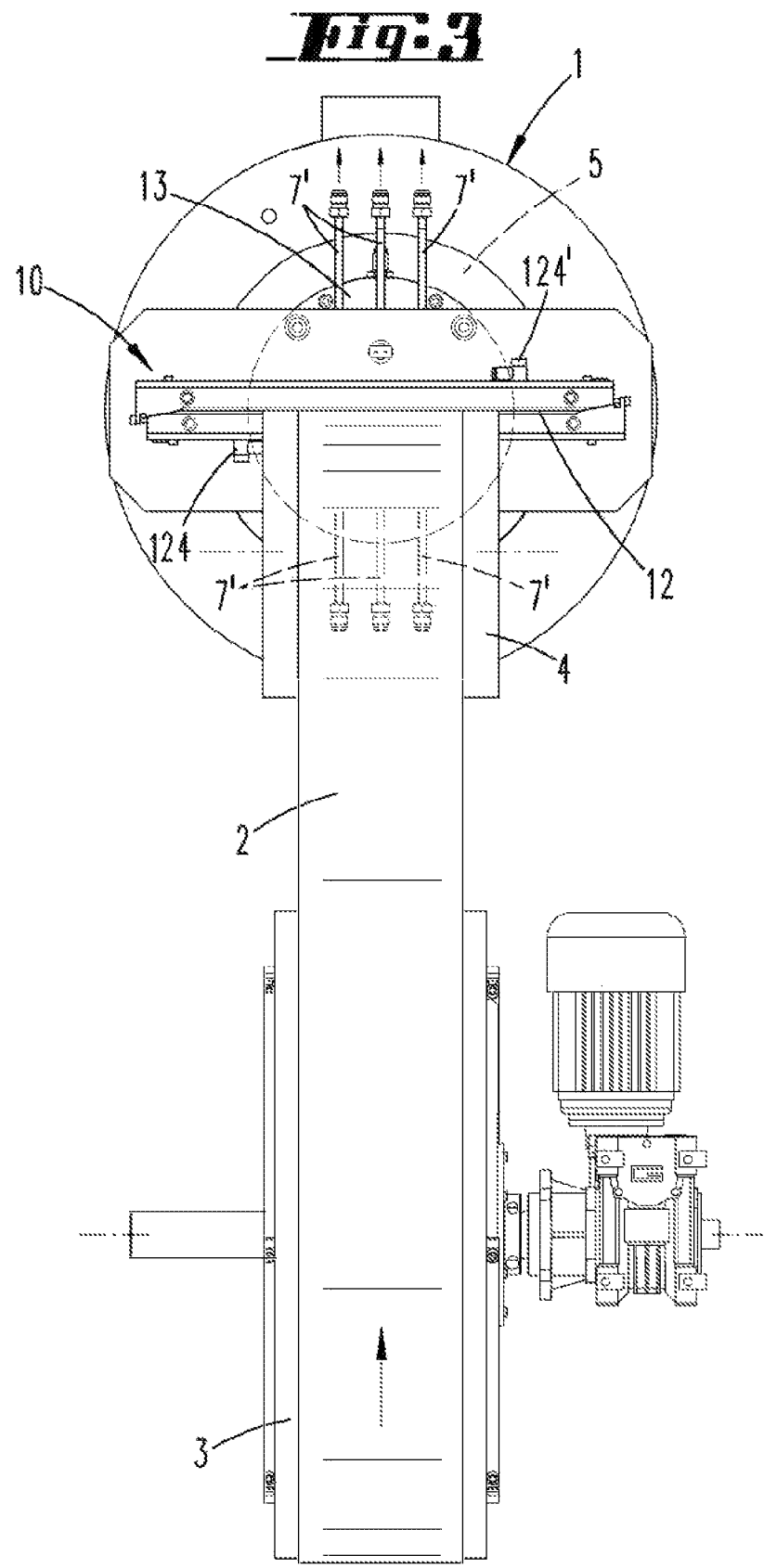
FIG. 3 shows a bottom view of the device illustrated in FIG. 1.
Figure 4:
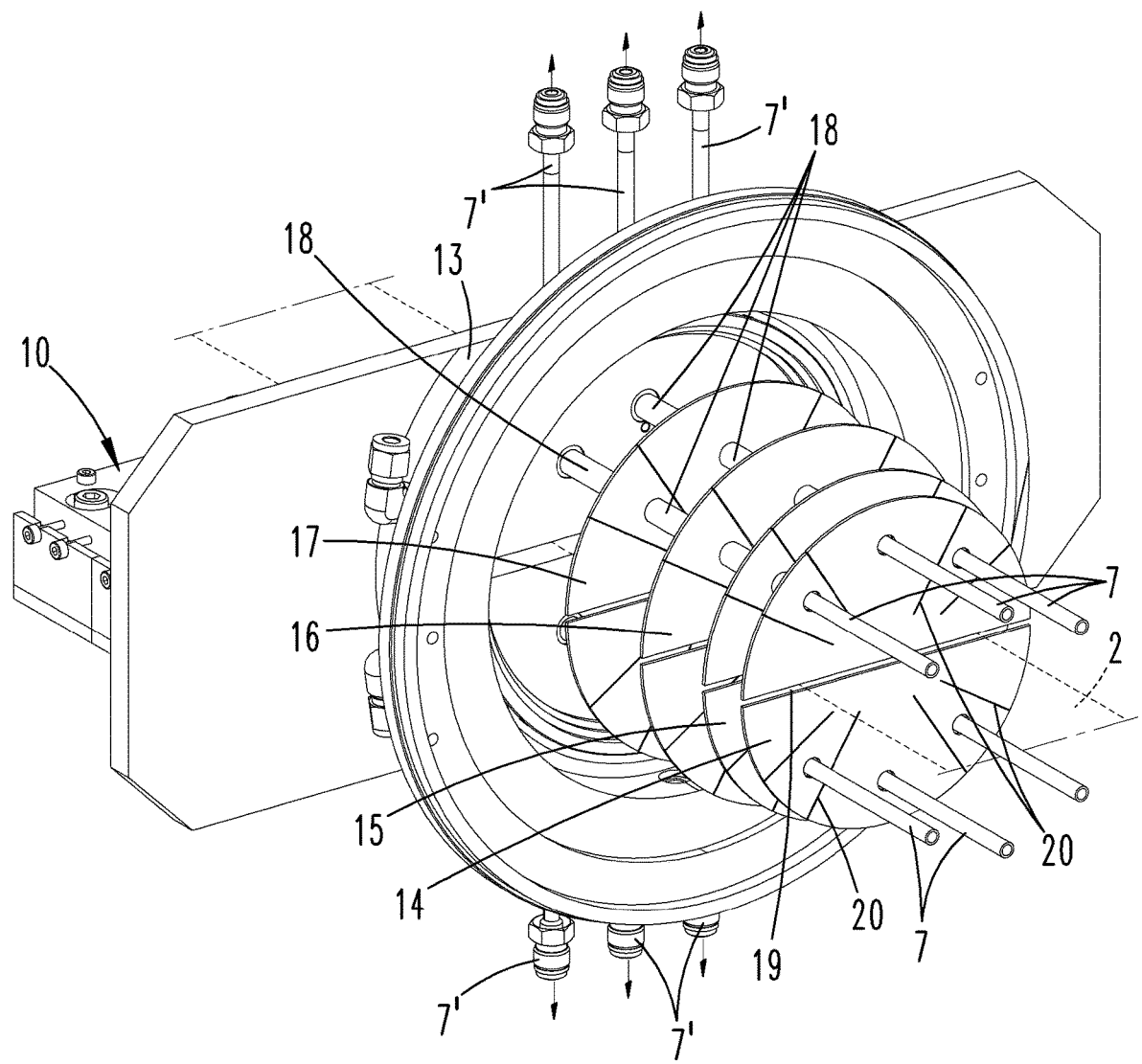
FIG. 4 shows a first perspective representation of heat transfer-inhibiting means 14, 15, 16, 17 that are fastened on a closing plate 13.
Figure 5:
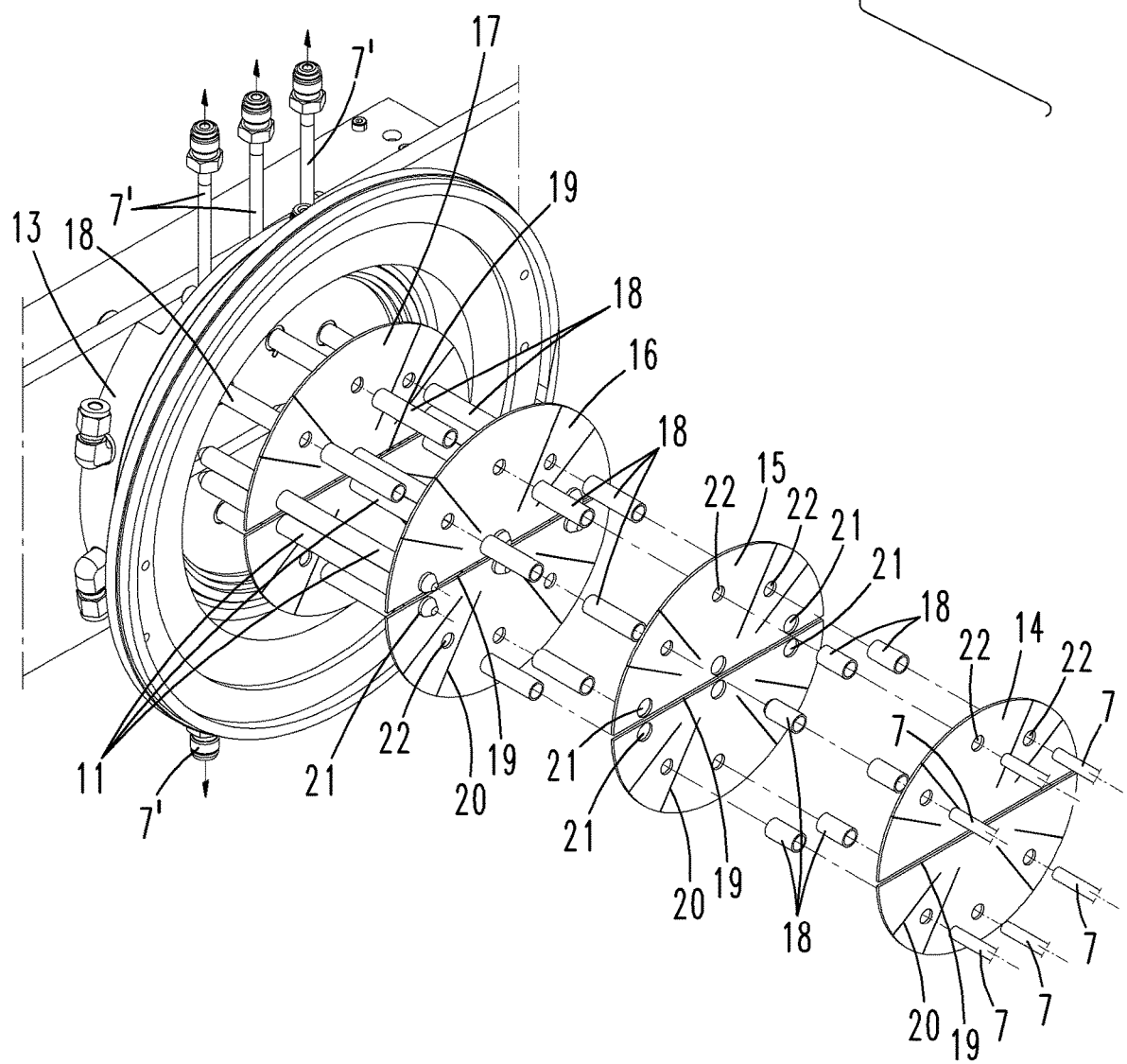
FIG. 5 shows an exploded view of the heat transfer-inhibiting means 14, 15, 16, 17.
Figure 6:
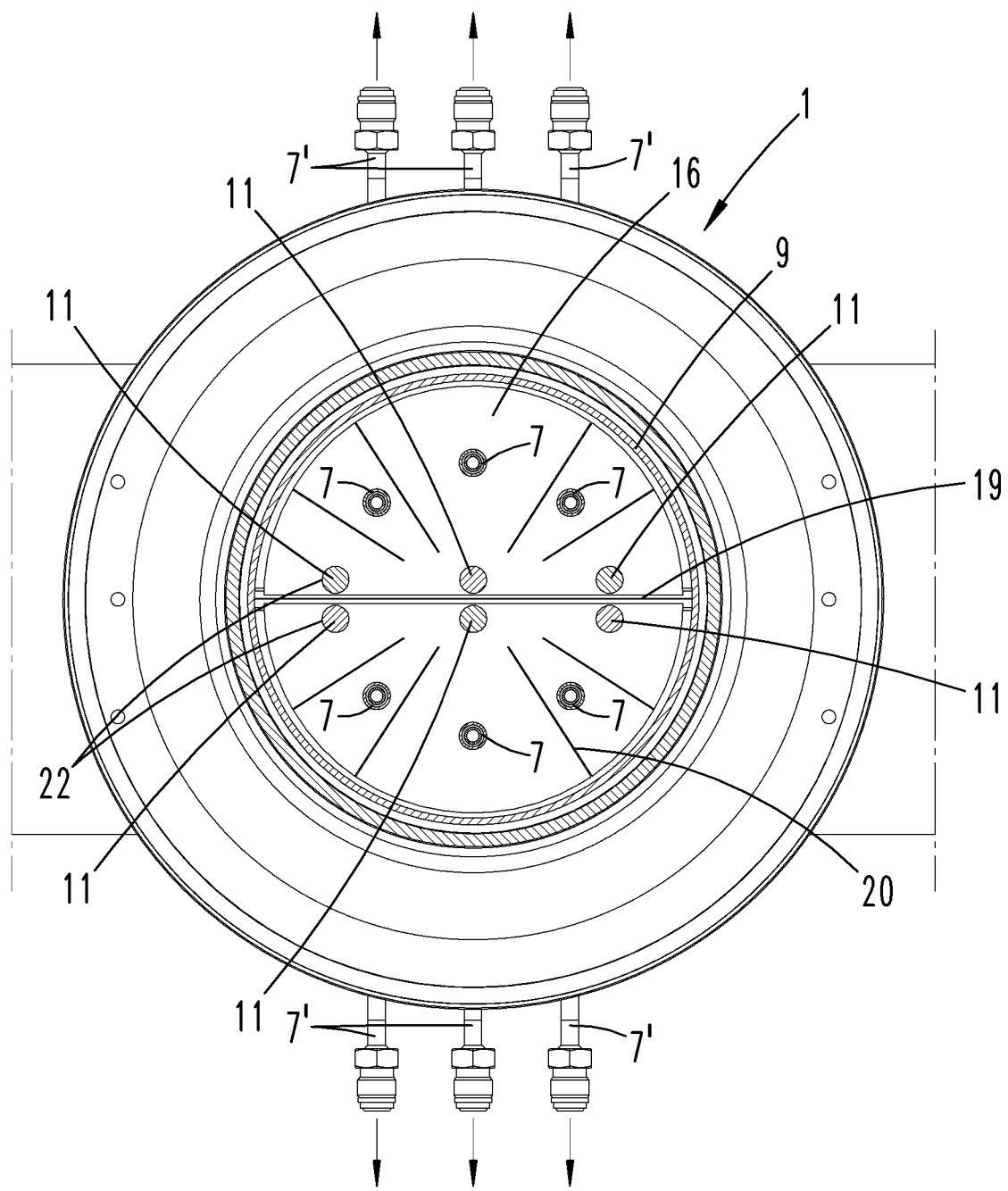
FIG. 6 shows a section along the line VI-VI in FIG. 2.

FIG. 1 shows a reactor, particularly a CVD reactor, with an elongate cylindrical shape, wherein the axis of the cylindrical housing 1 extends in the vertical direction. The two end faces of the reactor housing 1, which respectively point downward and upward, are closed with a closing plate 13. Gas supply conduits 6' and gas discharge conduits 7' lead into the closing plates. The gas supply conduit 6' continues into a pipe, the open end of which forms a gas inlet 6. The gas discharge conduit 7' continues into a pipe, the open end of which forms a gas outlet 7. The gas supply conduit 6' is connected to a gas supply system that particularly supplies $CH_4$. The gas discharge conduit 7' is connected to a vacuum pump, by means of which the internal pressure within the reactor housing can be approximately adjusted to atmospheric pressure.

An inner pipe 9 in the form of a liner pipe extends between the two closing plates 13. The cylindrical space enclosed by the inner pipe 9 forms an inlet region 5' adjacent to the lower closing plate 13 and an outlet region 5" adjacent to the upper closing plate 13. The inlet region 5' and the outlet region 5" are respectively surrounded by a helical tempering body 8', by means of which the region 5, 5' can be heated or cooled.

A processing zone 5 extends between the inlet region 5' and the outlet region 5" and is surrounded by a heating coil 8 in order to heat the processing zone 5 to a process temperature.

The lower closing plate 13 and the upper closing plate 13 respectively have a gap 12, through which a strip-shaped endless substrate 2 can be transported into and once again transported out of the reactor housing cavity. A diffusion barrier 10 is located outside the closing plate 13. This diffusion barrier consists of multiple gap delimiting bodies that serve for adjusting the gap width of the gap, through which the substrate 2 can be transported into the reactor housing or out of the reactor housing. The diffusion barrier 10 furthermore comprises gas infeed openings, by means of which a flushing gas can be introduced into the gap between the two gap delimiting bodies.

Multiple heat transfer-inhibiting means 14, 15, 16, 17 and multiple guide elements 11 for guiding the substrate 2 are located on the inner side of each of the two closing plates 13 facing the processing zone 5.

In the exemplary embodiment, the means 14, 15, 16, 17 for inhibiting the heat transfer from the processing zone 5 toward the closing plates 3 are formed by reflector plates 14, 15, 16, 17.

In the first exemplary embodiment illustrated in FIGS. 2 to 6, the reflector plates 14, 15, 16, 17 are formed by thin sheet metal plates that essentially have a circular outline and are respectively arranged in the inlet region 5' and the outlet region 5" in such a way that their surfaces are aligned transversely to the transport direction of the substrate. The reflector plates 14, 15, 16, 17 are spaced apart from one another by means of spacer sleeves 18. Each reflector plate 14, 15, 16, 17 is composed of two parts. These parts are respectively realized in the form of semicircular parts, wherein a gap 19, through which the substrate 2 can be transported, remains between said semicircular parts. A first reflector plate 17 is spaced apart from the closing plate 13 by a first distance with the aid of multiple spacer sleeves 18. A second reflector plate 16 is spaced apart from the first reflector plate 17 with the aid of spacer sleeves 18. A third reflector plate 15 is spaced apart from the second reflector plate 16 with the aid of spacer sleeves 18. A fourth reflector plate 14 is spaced apart from the third reflector plate 15 with spacer sleeves 18. The first and the second reflector plate 16, 17 have a diameter that essentially corresponds to the inside diameter of the inner pipe 9 whereas the third reflector plate 15 has a smaller diameter. Furthermore, the spacing between the third reflector plate 15 and the second reflector plate 16 is also smaller than the spacing between the second reflector plate 16 and the first reflector plate 17, which approximately corresponds to the spacing between the first reflector plate 17 and the closing plate 13. The spacing between the fourth reflector plate 14 and the third reflector plate 15 is once again smaller than the spacing between the third reflector plate 15 and the second reflector plate 16.

All reflector plates 14, 15, 16, 17 have radial slots 20 in the exemplary embodiment. The slot width of these radial slots 20 approximately corresponds to the material thickness of the reflector plates 14, 15, 16, 17.

First bores 22 are furthermore provided in each of the reflector plates 14, 15, 16, 17, wherein rods or pipes, on which the reflector plates 14, 15, 16, 17 are fastened, can extend through said first bores. The pipes may be the pipes for feeding the gas inlet 6 or the pipes connected to the gas outlet 7. However, this may also concern guide rods that merely have the function of guiding the reflector plates 14, 15, 16, 17.

Second bores 21 are provided directly adjacent to a linear outer edge of each part of a reflector plate 14, 15, 16, 17. These second bores 21 serve for receiving the aforementioned guide elements 11 in the form of rods. The rods are made of a ceramic material. The respective end faces of the rods may be supported on the closing plate 13 on the one hand and on the fourth reflector plate 14 on the other hand. It is particularly proposed to provide three pairs of opposite guide elements 11. Two guide elements 11 are respectively arranged on the two outer edges of the substrate 2. A third pair of guide elements 11 is arranged in the substrate center, i.e. centrally between the outer edges.

The reflector plates 14, 15, 16, 17 may also be shield plates of identical shape. The reflector plates 14, 15, 16, 17 or shield plates inhibit the heat transfer from the processing zone 5 toward the inlet opening 12 or toward the outlet opening 12'.

FIGS. 7 to 14 show a second exemplary embodiment of a shield plate 14, 15 or a reflector plate 14, 15. The means for inhibiting the heat transfer from the processing zone 5 toward the inlet region 5' or toward the outlet region 5" particularly are reflection elements 14, 15 or shield elements 14, 15. A heat transfer-inhibiting means according to the second exemplary embodiment consists of two metal sheets 14, 15 that are bent along a ridge line 14', 15' by an angle of approximately 90 degrees. The two metal sheets 14, 15 are connected to one another on the ridge lines 14', 15'. To this end, connecting webs 24 are provided in order to hold the ridge lines 14', 15' at a distance from one another such that a gap 19, through which the substrate 2 can be transported, is formed between the ridge lines 14', 15'.

The interconnected reflector or shield plates 14, 15 form a heat transfer-inhibiting means that essentially occupies the cross-sectional area of the inner pipe 9.

The two limbs of each reflector or shield plate 14, 15 are connected to one another with spacer sleeves 18. The ends of the sleeves may be rigidly connected to one of the limbs. Rods or pipes extend through these sleeves and respectively serve for holding the heat transfer-inhibiting means in a displaceable manner or for fixing the heat transfer-inhibiting means in position.

Figure 7:
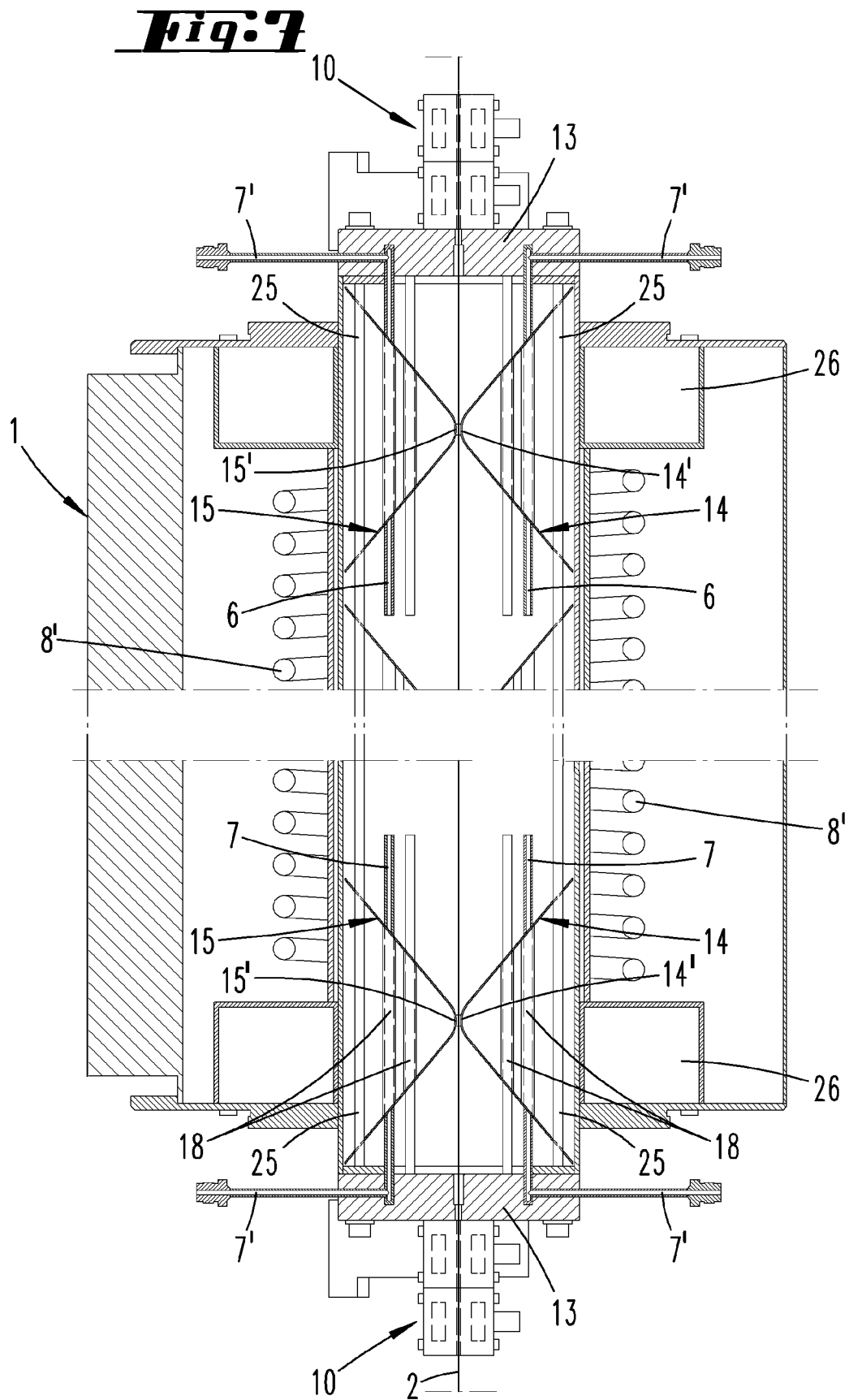
FIG. 7 shows a representation similar to FIG. 1, however, with heat transfer-inhibiting means according to a second exemplary embodiment.
Figure 8:
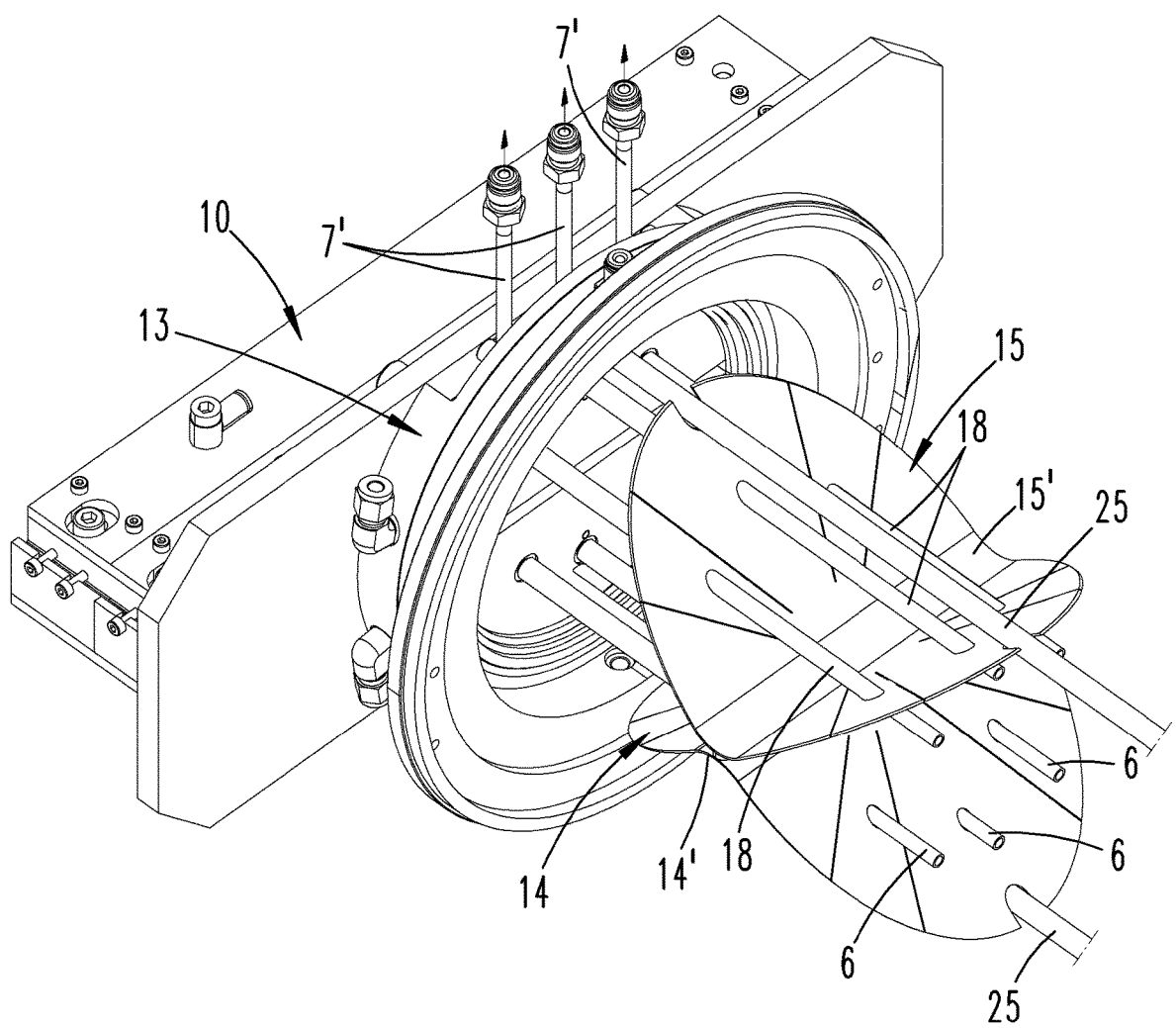
FIG. 8 shows a perspective representation of the second exemplary embodiment.
Figure 9:
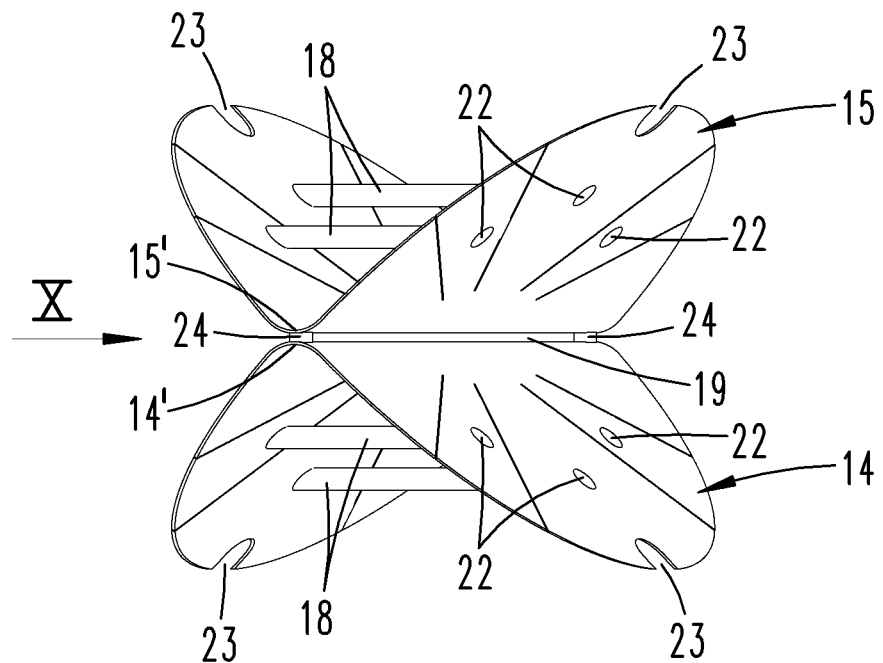
FIG. 9 shows a perspective representation of an individual heat transfer-inhibiting means according to the second exemplary embodiment.
Figure 10:
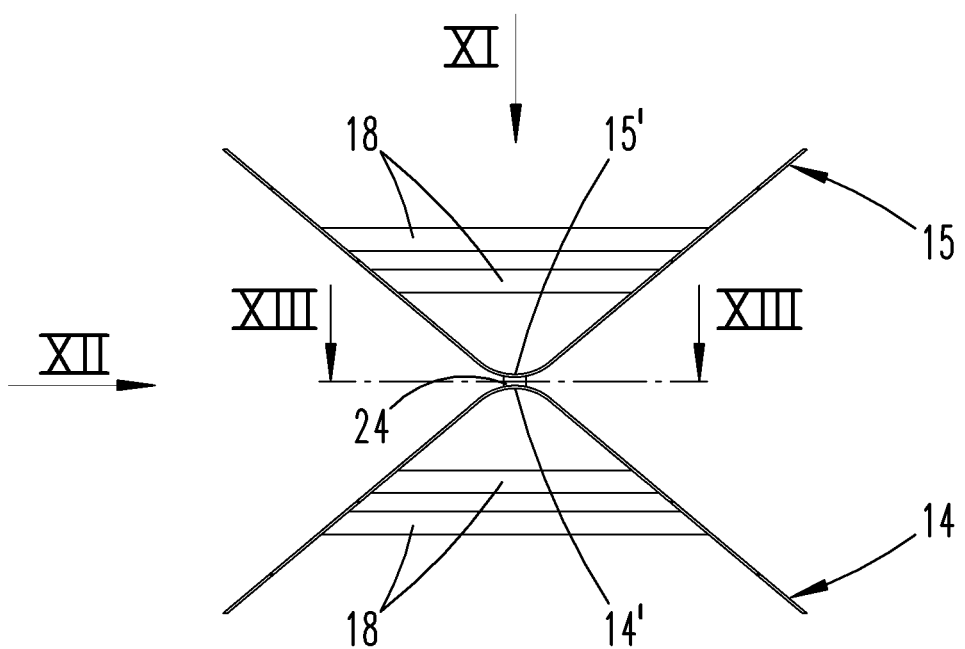
FIG. 10 shows a view in the direction of the arrow X in FIG. 9.
Figure 11:
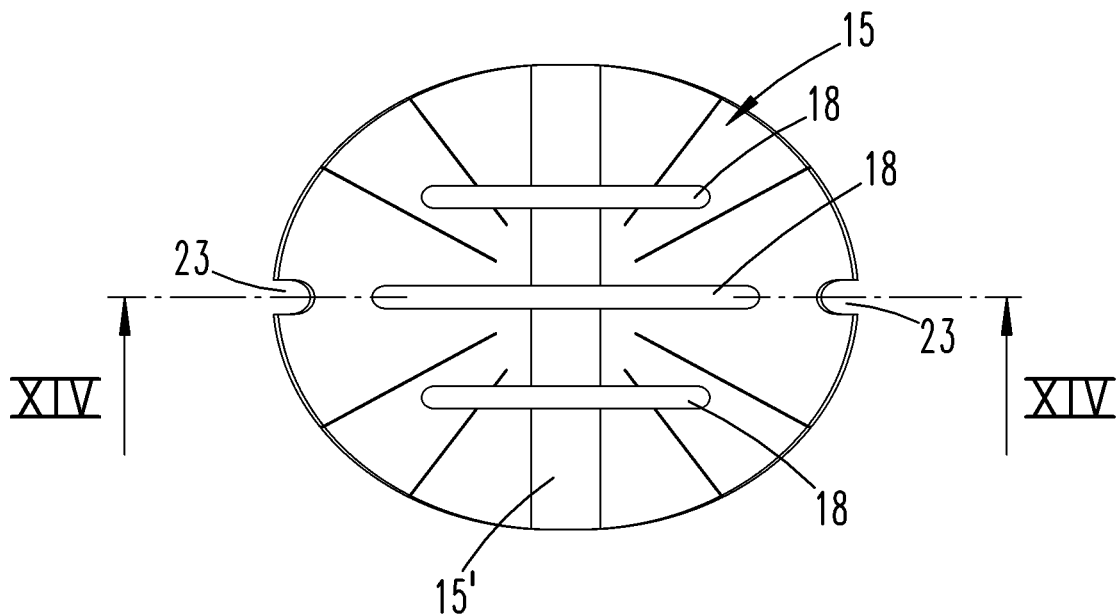
FIG. 11 shows a view in the direction of the arrow XI in FIG. 10.
Figure 12:
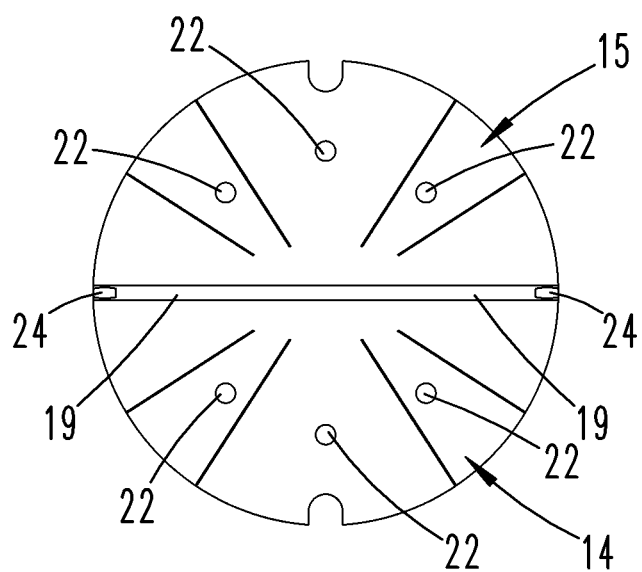
FIG. 12 shows a view in the direction of the arrow XII in FIG. 10.
Figure 13:
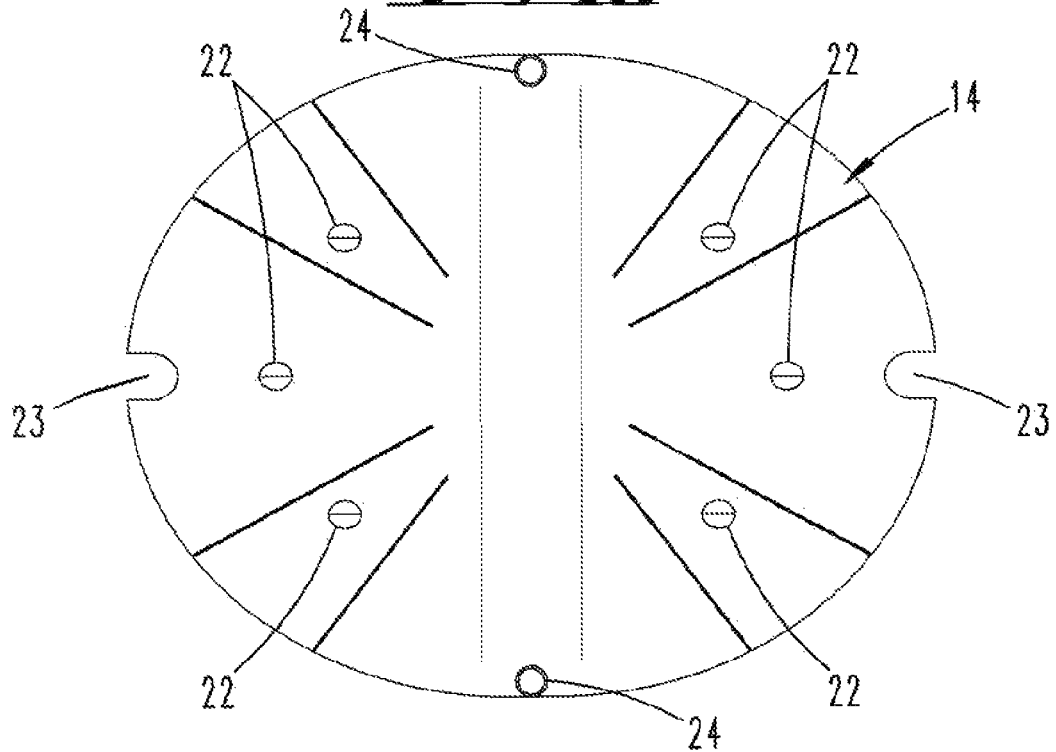
FIG. 13 shows a section along the line XIII-XIII, in FIG. 10.
Figure 14:
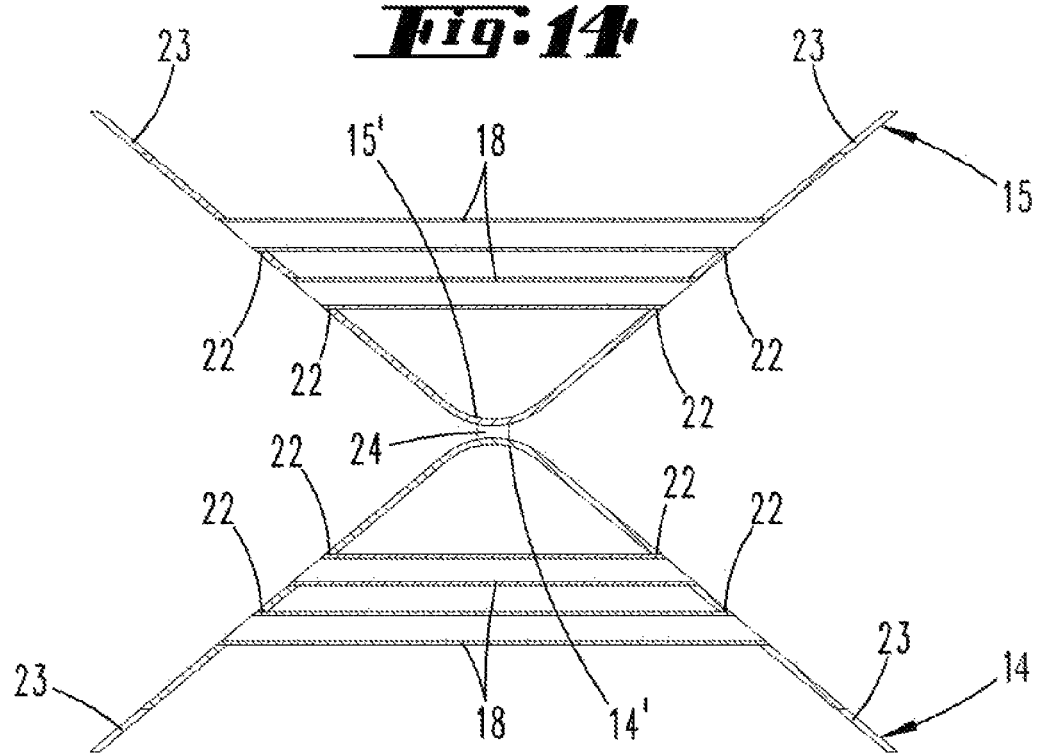
FIG. 14 shows a section along the line XIV-XIV in FIG. 11.
Figure 15:
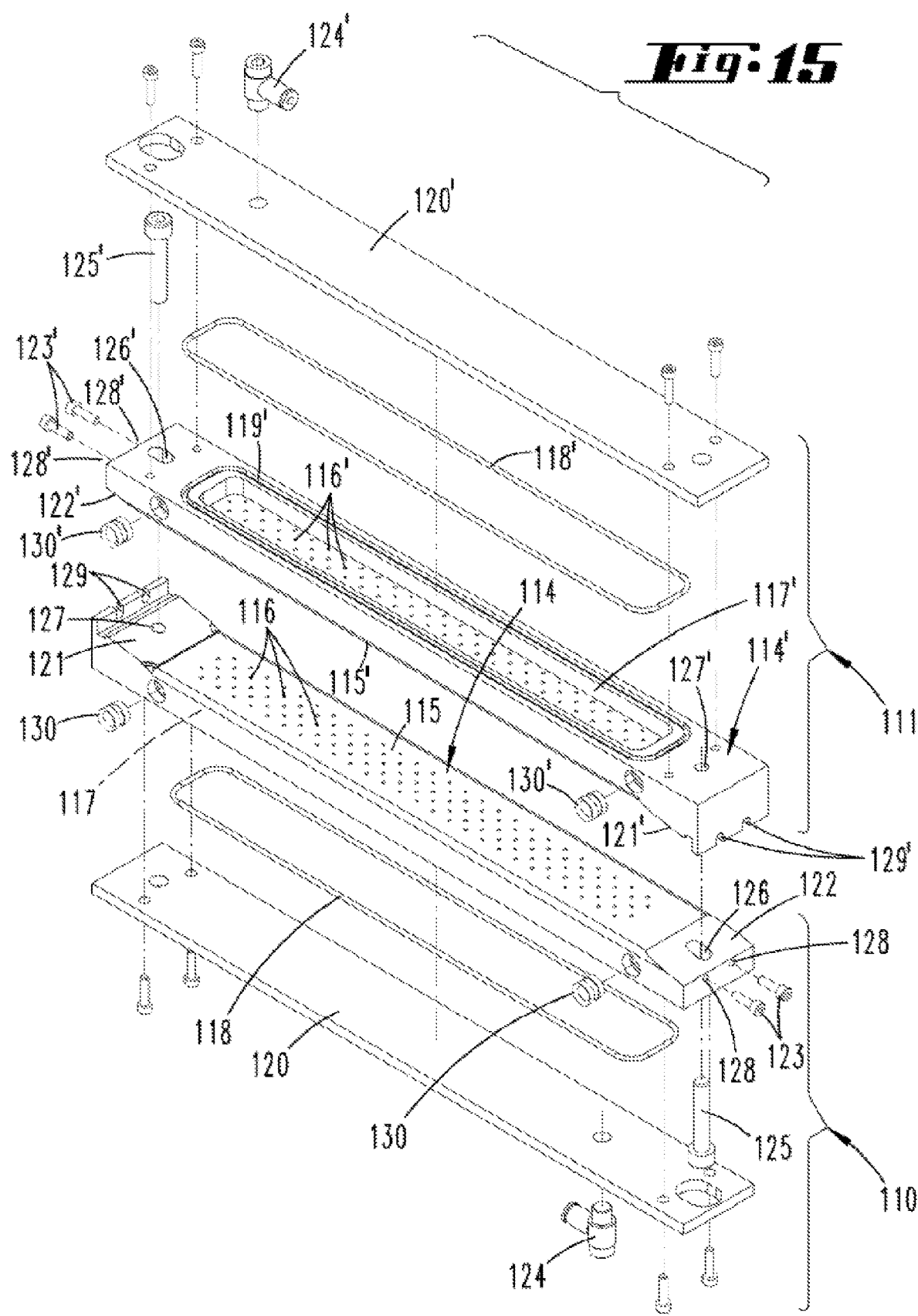
FIG. 15 shows an exploded view of two gap delimiting bodies 110, 111.
Figure 16:
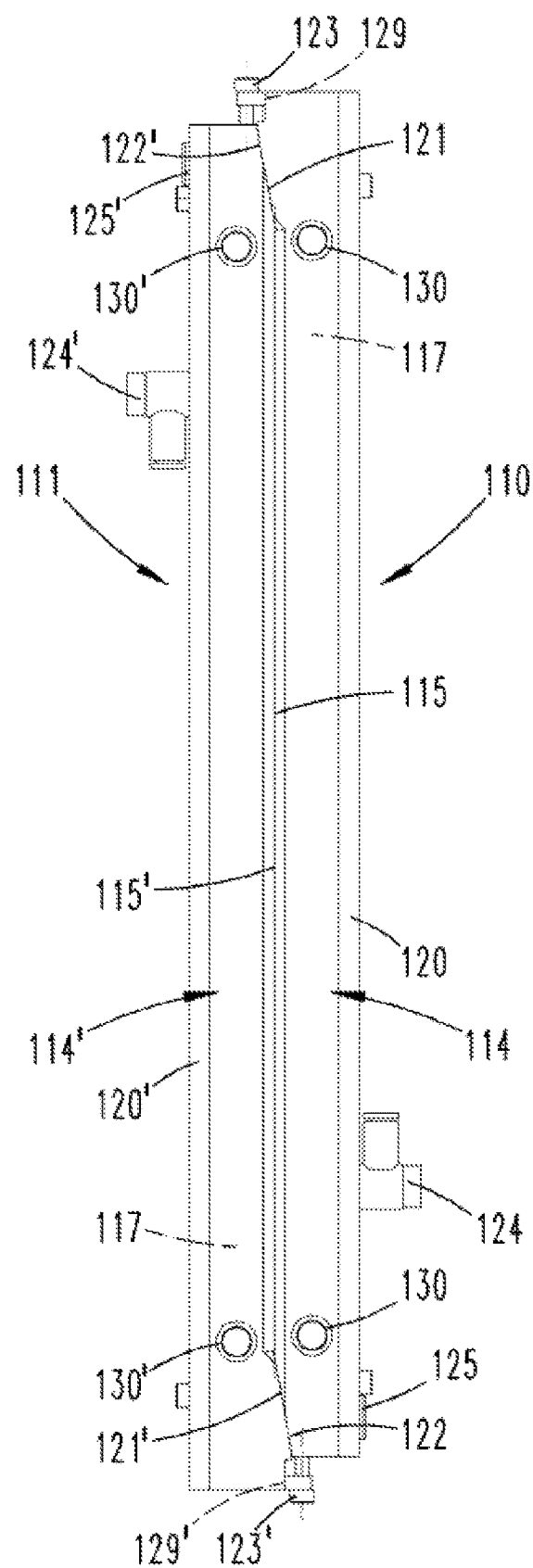
FIG. 16 shows a front view of the two gap delimiting bodies 110, 111 being mounted on one another viewed in the direction of the gap 112 in a first spacing position.
Figure 17:
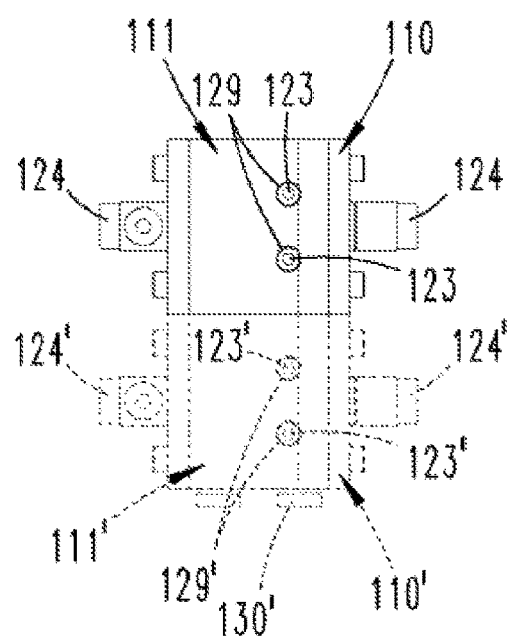
FIG. 17 shows two pairs of gap delimiting bodies 110, 111, 110', 111', which may be jointly arranged on the housing of the substrate treatment device 1 on the inlet side and on the outlet side.
Figure 22:
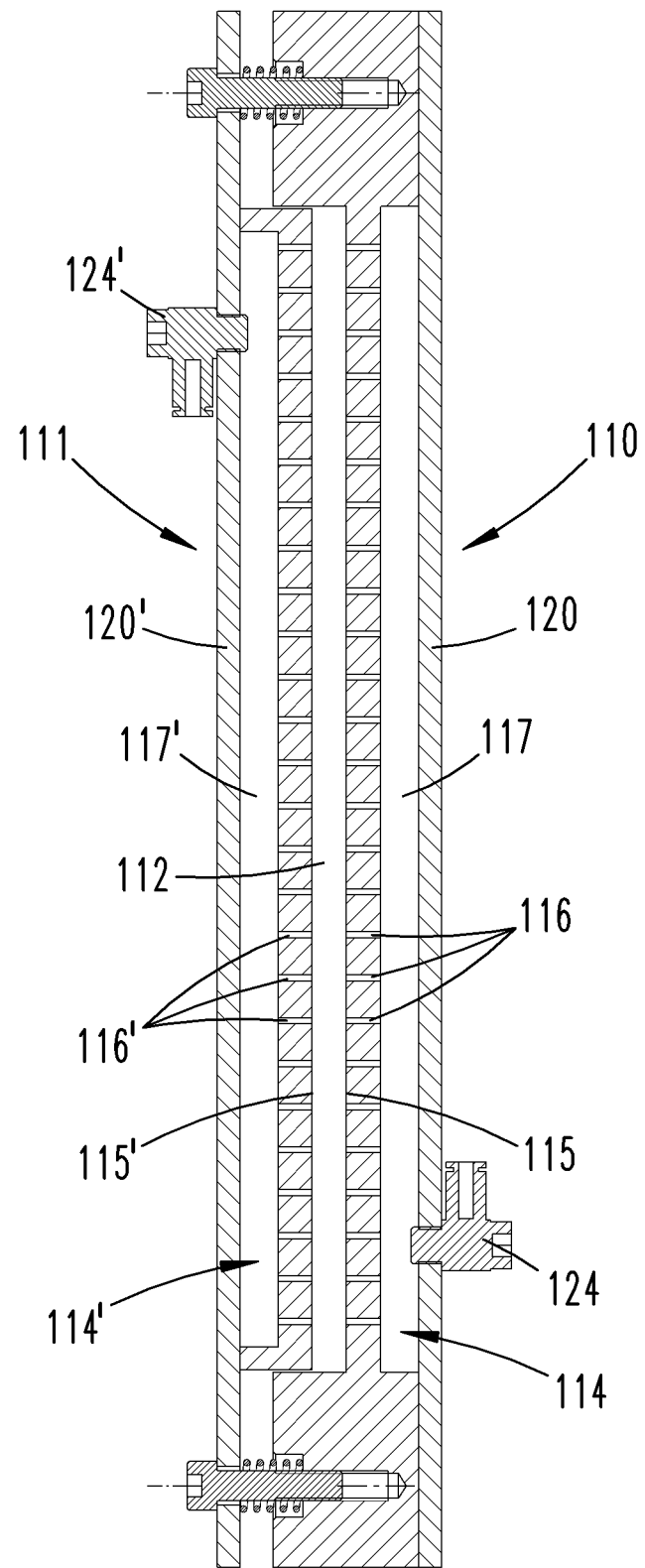
FIG. 22 shows a second exemplary embodiment of gap delimiting bodies 110, 111.

FIG. 7 furthermore shows a rod 25 that extends between the opposite closing plates 13 and lies in a recess 23 of the heat transfer-inhibiting means.

The inlet region 5' and/or the outlet region 5" may be respectively provided with just one heat transfer-inhibiting means.

The rolls 3, 3' may be operated by an electric motor. A first deflection roller 4 is provided for deflecting the substrate 2 entering the reactor 1 and a second deflection roller 4' is provided for deflecting the substrate 2 exiting the reactor housing 1.

A gas-flushed zone 26 is located directly adjacent to the closing plate 13 in the inlet region 5' and in the outlet region 5". An inert gas is introduced into this zone in the cavity of the reactor housing by means of a not-shown gas inlet.

FIGS. 15 to 22 concern another aspect of the invention.

The cavity of the substrate treatment device 1 is respectively closed with a closing plate 13, 13' on the inlet side and on the outlet side. The closing plate 13, 13' has a gap opening, through which the substrate 2 is transported. The closing plates 13, 13' carry on their respective outer sides an arrangement that respectively consists of two gap delimiting bodies 110, 110', 111, 111'. The gap delimiting bodies 110, 110', 111, 111' have gap delimiting surfaces or gap walls 115, 115' that face one another and are spaced apart from one another by approximately 0 to 5 mm. The gap width w preferably amounts to no more than 2 mm.

Two arrangements, which respectively consists of two gap delimiting bodies 110, 111, are respectively arranged behind one another in the transport direction of the gap on the inlet side and on the outlet side such that the substrate has to pass through two of these arrangements when it enters the substrate treatment device 1 and through two of these arrangements when it exits the substrate treatment device 1. We refer to FIGS. 15 to 21 with respect to the design of the arrangements of gap delimiting bodies 110, 111.

Each arrangement of gap delimiting bodies 110, 111 comprises two gap delimiting bodies 110, 111 that are designed identical to one another. In the assembled state, they have gap delimiting walls 115, 115' that face one another, wherein the gap 112 extends between said gap delimiting walls. The gap delimiting walls 115, 115' are formed by a base body 114, 114' that is made of steel, particularly special steel. In the exemplary embodiment, they are realized in the form of elongate base bodies 114, 114', the extending direction of which is oriented transversely to the transport direction of the substrate 2.

The rear sides of the base bodies 114, 114' lying opposite of the gap delimiting walls 115, 115' have a trough-shaped recess that respectively forms a gas distribution chamber 117, 117'. The base of the gas distribution chambers 117, 117' extends parallel to the gap delimiting wall 115, 115' and comprises a plurality of regularly arranged bores, wherein said bores form gas outlet openings 116, 116' leading into the gap delimiting wall 115 such that this gap delimiting wall forms a gas outlet surface. The opening of the depression forming the gas distribution chamber 117 is surrounded by an annular groove 119, 119', wherein a sealing cord 118, 118' such as an O-ring lies in said annular groove in order to cover the gas distribution chambers 117, 117' with a cover 120, 120' that is fastened on the base body 114, 114' by means of fastening screws. A flushing gas can be fed into the gas distribution chamber 117 by means of a gas supply conduit 124, 124' connected to the cover 120, 120'.

The gap delimiting wall 115, 115' forms a gas outlet surface. The gas outlet surface has an elongate shape, wherein the extending direction of the gas outlet surface 115, 115' is oriented transversely to the transport direction of the substrate 2. Identically oriented oblique surfaces 121, 121', 122, 122' lie adjacent to two opposite ends of the gas outlet surface 115, 115', which in the exemplary embodiment are formed by the narrow side ends of the gas outlet surface 15, 15'. The first oblique surface 121, 121' is sloped upward by approximately 10 degrees whereas the second oblique surface 122, 122' is sloped downward by approximately 10 degrees. The two oblique surfaces 121, 121', 122, 122' extend in parallel planes to one another.

The two gap delimiting bodies 110, 111 are placed on top of one another in such a way that a first oblique surface 121' of a second gap delimiting body 111 lies on a second oblique surface 122 of the first gap delimiting body 110 and a second gap delimiting surface 122' of the second gap delimiting body 111 lies on a first oblique surface 121 of the first gap delimiting body 110. A displacement in a direction, which is identified by the reference symbol S in FIG. 21, makes it possible for the oblique surfaces 121, 121', 122, 122' to slide along one another and to displace these oblique surfaces relative to one another. During such a displacement, the two gap delimiting bodies 110, 111 are not only displaced in a direction that lies in the gap plane, but also in a direction extending transversely thereto, such that the gap width w can be varied between a minimum gap width w" illustrated in FIG. 20 and a maximum gap width w' illustrated in FIG. 21. The direction of displacement, S, in which one gap delimiting body 110 is displaced relative to the other gap delimiting body 111, is respectively oriented obliquely to the surface normal of the gap delimiting wall 115, 115' or to the gap plane.

Set screws 123, 123' are provided for realizing a sensitive adjustment of the gap width w, wherein said set screws are respectively screwed into threaded bores 128, 128' in a broad side of the gap delimiting body 110, 111. The heads of the set screws 123, 123' act upon a sidewall of a respective other gap delimiting body 111 such that the gap width w can be adjusted by means of a rotational adjustment of the set screw 123, 123'. It is preferred to respectively arrange two set screws 123, 123' on both narrow sides of the base body 114, 114', wherein these set screws not only make it possible to adjust the gap width w, but also to fix the gap width w, because opposing screws act in opposite directions.

A threaded bore 127, 127' is located within the first oblique surface 121, 121'. The axis of the threaded bore 127, 127' extends in the direction of the surface normal of the gap wall 115, 115'. An oblong hole 126 for the passage of a fastening screw 125, 125' is located in the second oblique surface 122, 122', wherein said fastening screw can be screwed into the internal thread 127, 127' in order to tension the two gap surfaces 121, 122, 121', 122' relative to one another.

The reference symbols 130, 130' identify coupling elements, by means of which two pairs of gap delimiting bodies 110, 111, 110', 111' can be coupled to one another in such a way that the gaps 112 of the respective pairs are aligned with one another.

The preceding explanations serve for elucidating all inventions that are included in this application and respectively enhance the prior art independently with at least the following combinations of characteristics, wherein two, multiple or all of these combinations of characteristics may also be combined with one another, namely:

A device, which is characterized in that heat transfer-inhibiting means 14, 15, 16, 17 are arranged between the processing zone 5 and the inlet opening 12 and/or the outlet opening 12' and reduce a heat transfer from the processing zone 5 toward the inlet opening 12 or the outlet opening 12'.

A device, which is characterized in that the heat transfer-inhibiting means 14, 15, 16, 17 are one or more thermal radiation protection shields and/or reflectors and/or are formed by flat bodies extending transversely or obliquely to the transport direction and/or have a cross-sectional area that occupies more than 75 percent, preferably more than 80 percent or more than 90 percent, of the clear cross section of an inlet region 5' or outlet region 5", which lies adjacent to the processing zone 5 and in which the heat transfer-inhibiting means 14, 15, 16, 17 are arranged.

A device, which is characterized in that the heat transfer-inhibiting means 14, 15, 16, 17 made of sheet metal have slots 20 and/or through-bores 22 for rods 11 or pipes 6, 7 and/or are displaceably supported on rods 11 or pipes 6, 7 and/or are penetrated by a pipe of a gas inlet 6 or a pipe of a gas outlet 7 and/or consist of two parts, between which a gap 19 for the passage of the substrate 2 remains.

A device, which is characterized in that multiple heat transfer-inhibiting means 14, 15, 16, 17 are arranged behind one another in the transport direction and/or held at a distance from one another with the aid of spacer means and/or have reflection surfaces that differ from one another with respect to their size.

A device, which is characterized in that one or more heat transfer-inhibiting means 14, 15, 16, 17 are a single-part or multi-part flat body with a circular design and/or a flat body with a cruciform design and/or formed by two flat bodies 14, 15 that are bent about a ridge line 14', 15', wherein said flat bodies 14, 15 are connected to one another on the ridge lines 14', 15' in order to form a gap 19 for the passage of the substrate 2, and/or in that two flat bodies 14, 15 are connected to one another with connecting webs 24 in order to form a gap 19 for the passage of the substrate 2.

A device, which is characterized in that guide elements 11 for guiding the substrate 2 are arranged within the reactor housing 1 in an inlet region 5' bordering directly on the inlet opening 12 and/or in an outlet region 5" bordering directly on the outlet opening 12'.

A device, which is characterized by guide elements 11 for guiding the substrate 2, which are arranged within the housing 1 in an inlet region 5' and/or an outlet region 5", and/or in that guide elements 11 for guiding the substrate 2 extend into the cavity of the housing 1 directly adjacent to the inlet opening 12 or the outlet opening 12'.

A device, which is characterized in that guide elements 11 for guiding the substrate 2 are formed by rods, which extend in the transport direction and are arranged directly the gap 19 between two parts of a heat transfer-inhibiting means 14, 15, 16, 17 and/or are supported by heat transfer-inhibiting means 14, 15, 16, 17 and/or extend through bores 21 of the heat transfer-inhibiting means 14, 15, 16, 17.

A device, which is characterized in that the gap-shaped inlet opening 12 and/or the gap-shaped outlet opening 12', through which the substrate 2 being unwound from a first roll 3 and wound up on a second roll 3' and being continuously transported through the processing zone 5 passes, is flushed with an inert gas and/or in that the reactor housing 1 has the shape of a circular cylinder and the inlet opening 12 and/or the outlet opening 12' is arranged on one of the end faces of the reactor housing 1.

A device, which is characterized in that the transport direction of the substrate 2 through the reactor housing 1 is a vertical direction and/or in that the substrate 2 enters the reactor housing 1 through an inlet opening 12 arranged on the underside of the reactor housing 1 and/or exits the reactor housing 1 through an outlet opening 12' arranged on the upper side of the reactor housing 1 and/or in that a gas inlet 6 and a gas outlet 7 are arranged in an inlet region 5' and/or an outlet region 5" of the cavity of the reactor housing 1 in such a way that the gas flow through the processing chamber 5 is directed from the bottom toward the top.

A device, which is characterized in that the spacing between the two gap delimiting bodies 110, 110'; 111, 111', which defines a gap width w, is adjustable.

A device, which is characterized in that the first and the second gap delimiting body 110, 110'; 111, 111' are designed identically to one another.

A device, which is characterized in that surfaces 115, 115' of a respective base body 114, 114' of the gap delimiting body 110, 110'; 111, 11', which form delimiting walls of the gap 112, have gas outlet openings 116, 116' leading into the gap 112, wherein it is particularly proposed that the gas outlet openings 116, 116' are formed by bores that connect a gas distribution volume 117, 117' arranged in the gap delimiting body 110, 110'; 111, 111' to the gap 112, wherein it is particularly proposed that a plurality of gas outlet openings 116, 16' are distributed over the surface 115, 115' in a regular arrangement similar to a showerhead, and wherein it is particularly proposed that the gas outlet openings 116, 116' are arranged in multiple rows, particularly in at least four rows, which lie adjacent to one another in the transport direction.

A device, which is characterized in that two pairs of gap delimiting bodies 110, 110'; 111, 111' respectively lie behind one another in a transport direction of the particularly flat, strip-shaped substrate 2.

A device, which is characterized in that a first gap delimiting body 110, 110' has a first oblique surface 121 that abuts on a second oblique surface 122' of a second gap delimiting body 111, 111' and/or in that a first gap delimiting body 110, 110' has a second oblique surface 122 that abuts on a first oblique surface 121' of the second gap delimiting body 111, 111', wherein the gap delimiting bodies 110, 110'; 111, 111' can be displaced in a gap extending direction S, particularly transversely to a transport direction of the substrate 2, in order to adjust the gap width w, and wherein the gap width w can be varied due to a sliding motion of the first and second oblique surfaces 121, 121', 122, 122' on one another.

A device, which is characterized by a set screw 123 for adjusting the gap width w, wherein internal threads 128, 128', into which the threaded shafts of the set screws 123 are screwed, are provided in sidewalls that particularly extend perpendicular to the gap delimiting surfaces 115, 115', and wherein the heads of said set screws abut on sidewalls of a respective other gap delimiting body 110, 110'; 111, 111'.

A device, which is characterized in that base bodies 114, 114' of the gap delimiting bodies 110, 110'; 111, 111' have oblong holes 126, 126', wherein fastening screws 125, 125', which are screwed into the internal thread 127, 127' of a respective other gap delimiting body 110, 110'; 111, 111', extend through said oblong holes in order to press the abutting oblique surfaces 121, 121', 122, 122' against one another, and wherein it is particularly proposed that the oblong hole 126 and/or the internal thread 127, 127' is respectively arranged in the region of an oblique surface 121, 121', 122, 122'.

A device, which is characterized in that the gap width w is infinitely variable in a range between 0 and 5 mm and/or in that the angle of the oblique surface 121, 121', 122, 122' to the gap extending direction or the gap extending plane lies in the range between 5 and 40 degrees or 5 and 20 degrees, preferably in a range between 9 and 11 degrees.

A utilization of a device according to one of the preceding claims on a substrate treatment device 1, namely on two respective sides of the substrate treatment device 1 that face away from one another, wherein a substrate 2 being unwound from a first roll 3 enters a processing chamber 5 of the substrate treatment device 1 through a first arrangement of at least two gap delimiting bodies 110, 110'; 111, 111', is coated with graphene, carbon nanotubes or another coating in said processing chamber, exits from a second arrangement of at least two gap delimiting bodies 110, 110'; 111, 111' and is wound up on a second roll 3'.

All disclosed characteristics are essential to the invention (individually, but also in combination with one another). The disclosure of the associated/attached priority documents (copy of the priority application) is hereby fully incorporated into the disclosure content of this application, namely also for the purpose of integrating characteristics of these documents into claims of the present application. The characteristics of the dependent claims also characterize independent inventive enhancements of the prior art without the characteristics of a claim to which they refer, particularly for submitting divisional applications on the basis of these claims. The invention specified in each claim may additionally comprise one or more of the characteristics that were disclosed in the preceding description and, in particular, are identified by reference symbols and/or included in the list of reference symbols. The invention also concerns design variations, in which individual characteristics cited in the preceding description are not realized, particularly as far as they are obviously dispensable for the respective intended use or can be replaced with other, identically acting technical means.

LIST OF REFERENCE SYMBOLS

1 Substrate treatment device, reactor housing
2 Substrate
3 Roll
3' Roll
4 Deflection roller
4' Deflection roller
5 Processing zone
5' Inlet region
5" Outlet region
6 Gas inlet
6' Gas supply conduit
7 Gas outlet
7' Gas discharge conduit
8 Heating coil
8' Heating coil
9 Liner pipe
10 Diffusion barrier
11 Guide element
12 Inlet opening, gap
12' Outlet opening, gap
13 Closing plate
13' Closing plate
14 Fourth reflector plate, ridge element
14' Ridge line
15 Third reflector plate, ridge element
15' Ridge line
16 Second reflector plate
17 First reflector plate
18 Spacer sleeve
19 Gap
20 Slot
21 Bore
22 Bore, through-bore
23 Recess
24 Connecting web
25 Rod
26 Gas-flushed zone
110 Gap delimiting body
110' Gap delimiting body
111 Gap delimiting body
111' Gap delimiting body
112 Gap
114 Base body
114' Base body
115 Gap wall (gas outlet surface)
115' Gap wall (gas outlet surface)
116 Gas outlet opening
116' Gas outlet opening
117 Gas distribution chamber
117' Gas distribution chamber
118 Sealing cord
118' Sealing cord
119 Annular groove
119' Annular groove
120 Cover 120' Cover
121 Oblique surface
121' Oblique surface
122 Oblique surface
122' Oblique surface
123 Set screw
123' Set screw
124 Gas supply conduit
124' Gas supply conduit
125 Fastening screw
125' Fastening screw
126 Oblong hole
126' Oblong hole
127 Threaded bore, internal thread
127' Threaded bore, internal thread
128 Threaded bore, internal thread
128' Threaded bore, internal thread
129 Recess
130 Coupling element
130' Coupling element
w Gap width
w" Minimum gap width
w' Maximum gap width
S Displacement direction

What is claimed is:

1. A device for guiding a substrate (2) into or out of a substrate treatment device (1), the device comprising:
   a first gap delimiting body (110) comprising a first base body (114), the first base body (114) comprising a first planar surface (115), a first oblique surface (121) and a second oblique surface (122), wherein the first oblique surface (121) and the second oblique surface (122) are each oblique to the first planar surface (115), extend in a first plurality of parallel planes, and are connected to one another by the first planar surface (115); and
   a second gap delimiting body (111) comprising a second base body (114'), the second base body (114') comprising a second planar surface (115'), a third oblique surface (121') and a fourth oblique surface (122'), wherein the third oblique surface (121') and the fourth oblique surface (122') are each oblique to the second planar surface (115'), extend in a second plurality of parallel planes, and are connected to one another by the second planar surface (115'),
   wherein the first planar surface (115) and the second planar surface (115') are spaced apart by a gap (112) with a gap width (w),
   wherein the first oblique surface (121) abuts the fourth oblique surface (122'),
   wherein the second oblique surface (122) abuts the third oblique surface (121'), and
   wherein the first gap delimiting body (110) and the second gap delimiting body (111) are displaceable in a direction of respective slopes of the first, second, third and fourth oblique surfaces (121, 122, 121', 122') in order to adjust the gap width (w).

2. The device of claim 1, wherein the first and second gap delimiting bodies (110, 111) are identical to one another.

3. The device of claim 1, wherein the first planar surface (115) and the second planar surface (115') each has gas outlet openings (116, 116') leading into the gap (112).

4. The device of claim 3, wherein the gas outlet openings (116, 116') are formed by bores that connect a first gas distribution volume (117) arranged in the first gap delimiting body (110) and a second gas distribution volume (117') arranged in the second gap delimiting body (111) to the gap (112).

5. The device of claim 3, wherein the gas outlet openings (116, 116') are distributed over the first planar surface (115) and the second planar surface (115') in a regular arrangement.

6. The device of claim 3, wherein the gas outlet openings (116, 116') are arranged in multiple rows which lie adjacent to one another in a transport direction of the substrate (2) being guided into and out of the substrate treatment device (1).

7. A method of using a substrate treatment device (1) with a first instance of the device of claim 1 disposed on a first side of the substrate treatment device (1) and a second instance of the device of claim 1 disposed on a second side of the substrate treatment device (1), the first and second sides facing away from one another, the method comprising:
   unwinding a substrate (2) from a first roll (3);
   transporting the substrate (2) into a processing chamber (5) of the substrate treatment device (1) through the first instance of the device of claim 1;
   coating the substrate (2) with graphene, carbon nanotubes or another coating in said processing chamber (5);
   transporting the substrate (2) out of the processing chamber (5) through the second instance of the device of claim 1; and
   winding up the substrate (2) on a second roll (3').

* * * * *